US010587198B2

(12) United States Patent
Herbert et al.

(10) Patent No.: US 10,587,198 B2
(45) Date of Patent: Mar. 10, 2020

(54) CLOCKED POWER SUPPLY WITH LOW-VOLTAGE OUTPUT

(71) Applicant: Siemens Aktiengesellschaft, Munich (DE)

(72) Inventors: Thorsten Herbert, Rohr (DE); Harald Schweigert, Vienna (AT)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 15/379,795

(22) Filed: Dec. 15, 2016

(65) Prior Publication Data

US 2017/0179835 A1    Jun. 22, 2017

(30) Foreign Application Priority Data

Dec. 22, 2015   (DE) .................. 10 2015 226 430

(51) Int. Cl.
*H02M 3/335*    (2006.01)
*G01R 15/14*    (2006.01)
*H02M 1/08*    (2006.01)
*H03K 3/011*    (2006.01)
*H03K 3/017*    (2006.01)
*H02M 1/00*    (2006.01)

(52) U.S. Cl.
CPC ...... *H02M 3/33507* (2013.01); *G01R 15/146* (2013.01); *H02M 1/08* (2013.01); *H03K 3/011* (2013.01); *H03K 3/017* (2013.01); *H02M 2001/0009* (2013.01)

(58) Field of Classification Search
CPC ............. H02M 1/08; H02M 3/33507; H02M 2001/0006; H02M 2001/0009; H03K 3/011; H03K 3/017
See application file for complete search history.

(56) References Cited

U.S. PATENT DOCUMENTS

| 3,356,928 | A | | 12/1967 | Parrish | |
|---|---|---|---|---|---|
| 4,668,905 | A | * | 5/1987 | Schierjott | ............ H02H 7/1213 323/287 |
| 5,349,157 | A | * | 9/1994 | Blankenship | ........ B23K 9/1006 219/130.32 |
| 8,823,362 | B2 | * | 9/2014 | Koch | ..................... G01R 19/20 324/117 H |

(Continued)

FOREIGN PATENT DOCUMENTS

| CN | 85108840 | 7/1986 |
|---|---|---|
| CN | 102457187 | 5/2012 |

(Continued)

*Primary Examiner* — Kyle J Moody
(74) *Attorney, Agent, or Firm* — Cozen O'Connor

(57) ABSTRACT

A clocked power supply unit with low-voltage output for direct current includes at least one secondary winding of a transformer, a rectifier connected to the secondary winding, two outputs upon which a predefined output voltage is able to be tapped, and a shunt which is configured to provide a voltage signal which is proportional to the output current, wherein electrical measurement contact points are provided at which either a measurement voltage proportional to the output current and diverted from the shunt, or a measurement current diverted from the shunt, may be tapped from outside the power supply unit via the test points of a voltage and/or current measuring device.

25 Claims, 4 Drawing Sheets

(56) References Cited

U.S. PATENT DOCUMENTS

| | | | | |
|---|---|---|---|---|
| 8,842,403 B2* | 9/2014 | Hummel | ............... | H02H 3/08 |
| | | | | 361/18 |
| 9,035,565 B2* | 5/2015 | Zimmermann | .... | H05B 33/0815 |
| | | | | 315/247 |
| 9,252,662 B2* | 2/2016 | Tischler | ............ | H05B 33/0815 |
| 9,781,780 B1* | 10/2017 | Van Arendonk | ... | H05B 33/0809 |

FOREIGN PATENT DOCUMENTS

| | | |
|---|---|---|
| CN | 102956204 | 3/2013 |
| CN | 103913610 | 7/2014 |
| DE | 102013215571 | 2/2015 |

\* cited by examiner

CLOCKED POWER SUPPLY WITH LOW-VOLTAGE OUTPUT

BACKGROUND OF THE INVENTION

1. Field of the Invention

The invention relates to a clocked power supply unit with a low-voltage output for direct current comprising at least one secondary winding of a transformer, one rectifier which is connected (indirectly or directly) to the secondary winding, two outputs at which a predefined output voltage is able to be tapped, and a shunt which is configured to provide a voltage signal or a current signal which is proportional to the output current.

2. Description of the Related Art

A power supply unit generally comprises an input stage into which the supply voltage (input voltage) is fed as alternating voltage, i.e., from the alternating current network or a semiconductor bridge and is supplied to a primary winding of a transformer. The output stage of a power supply unit comprises the secondary winding of the transformer and a rectifier. Between the secondary winding and the rectifier and/or the shunt, naturally a further stage may be interposed, i.e., a step-down converter or "buck" regulator.

Such power supply units are often used in switchgear cabinets for electrical systems to provide a predefined supply voltage (control voltage) to a control electronics unit, such as 24 V DC. In principle, however, direct voltages of up to 120 V come within the low-voltage range, while below 60 V DC is referred to as harmless voltages that do not require any particular shielding.

If power supply units cited in the introduction are used in switchgear cabinets for electrical systems, the distribution of the output voltage as control voltage in the switchgear cabinet occurs via insulated individual conductors that are laid in cable channels together with signal lines. Frequently, up to 20 individual conductors are laid in a cable channel so that the temporary removal of a cable for measuring purposes, i.e., for measuring the output current of the power supply unit, is very complex.

When testing a switchgear cabinet during the production thereof in the workshop, when an error search is performed at the installation site of the switchgear cabinet during the start-up of the electrical system supplied by the switchgear cabinet, when performing maintenance operations or an error search during operation of the electrical system, the measurement of the supply current delivered by the power supply unit, generally 24 VDC, is a significant feature of the diagnosis and error limitation.

The measurement of the power consumption of a fully wired electrical system is complex and time-consuming because either the system has to be switched off or the conductor to be measured has to be cut off from the power supply and an ammeter has to be looped in. Due to time constraints during the error search, time-consuming tests are postponed and only performed when a first rapid diagnosis provides no indication of the error. If a simple and rapid error search were available to the service technician, defects that are present in the control electronics system and are able to be identified by a greater supply current consumption (such as in proximity switches, or light barriers) could be rapidly identified and eliminated during the error search.

Only the following methods for identifying errors by determining the power consumption have been available hitherto.

A service technician measures the control voltage via of a multi-meter or installs a voltage-dependent display in the output current circuit. The display is able to indicate via an LED, for example, the presence of the desired output voltage and/or control voltage of, for example, 24 V and/or via an LED when a voltage threshold, such as 21 V, is fallen below. These two conventional methods permit only a very indirect assessment of the power consumption of the control voltage because it is only possible to identify large increases in the power consumption that overload the supplied power supply such that the output voltage drops.

A conventional method for direct measurement of the output current comprises disconnecting the output terminal from the power supply unit and looping in an ammeter. This requires the electrical system to be switched off or to be partially switched off, because the looping in is only able to occur in the current-less state. Otherwise, when the contacts "bounce" it results in multiple brief stoppages before the ammeter is looped in. These undesired stoppages may cause an additional unforeseeable reaction of the electrical system, such as reset functions, multiple activation of actuators and the like, which is not generally accepted by the service technician (and by the system operator).

Instead, a clip-on ammeter that is suitable for direct current could also be looped into the control voltage output of the power supply unit. This is theoretically possible even when the system is in operation because a cable connection does not have to be disconnected. The drawback with this conventional method is that the conductors that are frequently tightly laid in a cable channel are inaccessible and/or the threading of the conductor through the tight layout is difficult. The conductor, therefore, during operation has to be pulled sufficiently far out of the cable channel for the clip-on ammeter to fit through with the magnetic clip. If the cable of the conductor is laid without movement loops, i.e., without an excess length, it is often impossible to pull it out. The system operators, however, generally do not, in any case, permit the conductor to be pulled during operation, resulting in the system having to be definitely switched off.

A further method for determining the output current is that of an electronically generated signal that is proportional to the output current and is provided at a test point. This conventional method generally requires amplification of a small voltage signal that is delivered by a current measuring resistor, also called a shunt, and provided to the customer at a measurement output of the power supply unit. Thus, for example, a voltage that by the ratio $1V=1$ A represents a measurement of the output current may be provided at a measurement output. In order to achieve sufficient accuracy, expensive operation amplifiers, i.e., those with low offset voltage, are used and a similarly expensive reference voltage source, with a low tolerance for temperature and ageing. In any case, a relatively small additional error may occur with expensive operation amplifiers and reference voltages that further increase the inaccuracy of the shunt.

The installation of current measuring devices in the power supply unit might also be possible, where the current measuring devices measure the output current and either display it locally on the power supply unit or transmit it to a superordinate controller, i.e., via a data bus. The method of the installed current measuring device, however, is too complex and costly for many applications.

SUMMARY OF THE INVENTION

In view of the foregoing, it is an object of the present invention to provide a power supply unit that permits the output current to be determined without costly units being additionally installed in the power supply unit and without the power supply having to be interrupted for looping in measuring devices.

This and other objects and advantages are achieved in accordance with the invention by a clocked power supply unit with low-voltage output for direct current, comprising at least one secondary winding of a transformer, a rectifier that is connected to the secondary winding, two outputs at which a predefined output voltage is able to be tapped, and a shunt that is configured to provide a voltage signal or current signal that is proportional to the output current.

In accordance with the invention, electrical measurement contact points are provided at which a measurement voltage that is proportional to the output current and diverted from the voltage drop at the shunt, or a measurement current diverted from the shunt, may be tapped from outside the power supply unit via the test points of a voltage measuring device (or in the case of a measurement current, a current measuring device). If required, the test points, i.e., the measurement contacts, of an expensive voltage and/or current measuring device (multi-meter) may be applied at these measurement contact points and the measurement voltage and/or measurement current may be measured. Any deviation of this measured voltage (and/or this measured current) from the known voltage (and/or the known current) (for example, measured once before in this manner) at these measurement contact points, at rated load and/or full load, is a measurement of any alteration to the output current.

In this case, the invention preferably uses a shunt that is formed from existing components of the power supply unit and/or that is provided as a separate component and is required in any case for other operating functions in the power supply unit, i.e., as an actual current value sensor for the current limiting control. Thus it may be provided, for example, that the shunt is configured as a separate component in the form of a current measuring resistor that is connected to a current limiting unit. This is the case in power supply units which have a shunt installed in the "output circuit", i.e., the secondary side in power supply units supplied by the mains network, in accordance with the objects of the invention, in order to limit the current. Here, the output current that flows through the shunt leads to a linear and directly proportional voltage drop in the shunt that is fed into the current limiting unit.

The components for limiting the current only have to be sufficiently accurate when exceeding the rated current, where the voltage signal of the shunt in any case has the highest value in the operating area. However, it is expected that a current monitor has an approximately consistent accuracy even in the case of a partial load. Nevertheless, if cost-effective operation amplifiers are used in the current limiting unit, the offset voltage thereof being relatively high, in the case of small current values, i.e., in the case of partial loading of the power supply unit and thus small useful signals to be amplified, a high offset voltage leads to disproportionately large errors. These errors would also mislead a technician when testing the system.

In this regard, it is more advantageous if the measurement of the voltage signal or current signal diverted from the shunt is achieved via an expensive voltage and/or current measuring device (multi-meter), the contacts thereof, for example, being held at the measurement contact points, such as by the service electrician. Thus, the accurate measurement of a very small voltage signal ranging from a few millivolts up to a few 100 millivolts does not constitute any difficulty for such multi-meters. Commercially available multi-meters are able to measure voltages ranging from 10-100 microvolts or a current signal in the range of a few μA to mA with sufficient accuracy, i.e., with an accuracy in the single digit percentage range.

Generally, shunts used in electronics have a tolerance of 1-2%, whereby the output current and the voltage drop produced thereby in the shunt have a very close correlation that serves as a basis for the subject of the invention.

However, even with the presence of a shunt for the current limiting unit, an additional shunt may also be installed in the output circuit from which the measurement voltage and/or the measurement current is diverted. If a shunt is not present for a current limiting unit, a shunt configured as a component may also be installed simply for measuring the measurement voltage or the measurement current diverted therefrom.

The shunt, however, does not have to be configured as a separate component but the shunt may also form a portion of a winding material of the power supply unit, where a filter is provided with a cutoff frequency that is less than the clock frequency of the power supply unit for the measurement voltage diverted from the voltage drop. In this case, therefore, the ohmic component of a winding material is used as a shunt. Here, the winding material may be a coil or throttle, where output current flows therethrough in at least one time period of the switching time of the power supply unit. It might also be conceivable to use a flyback converter therefor, where the output current and/or load current only flows through the flyback converter during the demagnetized time. Thus the duty cycle, which is generally dependent on the load and the input voltage, is included in the measurement voltage. However, this may be at least partially compensated by corresponding circuits.

The filter required in the case of a winding material as a shunt is generally an RC low pass filter. In this case, the RC member forms an approximately ideal filter because there is no possibility of direct voltage on the winding material apart from the voltage drop due to the ohmic resistance. In order to obtain no residual ripple influencing the measurement result by the switching frequency or clock frequency, it is advantageous if the filter limit frequency is below the clock frequency by a factor of at least 1000.

The shunt used in accordance with the invention, however, may also simply be a portion of an electrical connection, i.e., for example, a portion of a strip conductor, a conductor or a terminal of the output circuit of the power supply unit. Only the output current has to flow through this portion. The length of the portion may be easily fixed by the arrangement of the measurement contact points.

A first measurement contact point may be provided upstream and a second measurement contact point may be provided immediately downstream of the shunt in the output current circuit. By "immediately" is understood that no additional electrical components are present between the second measurement contact point and the shunt. At the first measurement contact point, a protective resistor is generally provided between the shunt and measurement contact point.

A simple embodiment of the invention is that at least one, in particular the first, measurement contact point is located or arranged on a conductor strip in the power supply unit, where this measurement contact point is able to be brought into contact, via an opening in the housing of the power supply unit, i.e., with a test point of a voltage or current measuring device. To this end, channels may be provided in the housing of the power supply unit for guiding the test point, where the channels lead to the measurement contact point so that other conducting parts are unable to be inadvertently brought into contact with the test point. The channels may be configured in the simplest manner by the housing of the power supply unit.

The measurement contact point may be configured as a blank conductor strip surface on a printed circuit board of the power supply unit, or as a metal tongue inserted into the printed circuit board, or as a test plug or terminal that in each case are connected to a conductor strip in an electrically conductive connection. In particular, with the use of blank conductor strip surfaces, the opening in the housing may be configured such that no other components of the electronics of the power supply unit can be brought into contact inadvertently when performing measurements using the test point of a voltage or current measuring device.

The second measurement contact point may also be configured as the first measurement contact point inside the power supply unit. This is the case when the shunt is arranged at a distance from the output, upstream of other components, for example, when it is positioned upstream of an output filter or when a long connection is present between the shunt and output that might also falsify the measurement voltage and/or the measurement current due to voltage drops.

If, however, no components or cables falsifying the measurement voltage are present between the shunt and the output, for simplification at least one, in particular the second, measurement contact point may be formed through an output of the power supply unit, which is often easily accessible. Thus a pole of an output or signal terminal may be used, i.e., of the 0V output. When performing measurements using a mult-imeter, the 0V output or a relay signal may then be connected in for the first measuring point at the first measurement contact point. As a result, the creation of a further measurement contact point with a channel in the housing is dispensed with.

It is not necessary for the signal diverted from the shunt to be amplified. As a result, it is advantageous if an amplifier component is not provided between the shunt and the measurement contact points. The measurement voltage or the measurement current diverted therefrom may be conducted directly via a cable to a measurement contact point, and a protective resistor may be provided between the shunt and the measurement contact point.

Depending on the arrangement of the shunt in the circuit pulsed currents may also flow through the shunt, i.e., when the shunt is positioned in a cable, where loading currents flow into the load capacitor. Here, it is expedient to smooth the shunt signal via an RC member, in order not to exceed the cutoff frequency of a standard multi-meter and to produce an incorrect display.

In order to obtain a measurement voltage that is more easily convertible into amperes, a voltage divider consisting of at least two resistors is provided parallel to the shunt, where at least one measurement contact point is provided between two resistors of the voltage divider, so that a partial voltage of the voltage drop at the shunt may be measured on at least one of the resistors of the voltage divider. However, the measurement current flowing through one of the resistors toward the other measurement contact point could also be tapped on one of the resistors of the voltage divider.

It is particularly advantageous if the resistor at which a partial voltage may be tapped, in comparison with the remaining resistors of the voltage divider, is dimensioned such that the partial voltage corresponds to a decimal fraction of the output current. Thus the resistor may be dimensioned, for example, such that 10 mV=1 A, whereby the user rapidly comes to a definitive result without calculating and simply by displacing the decimal point. The same applies in the case of measuring a measurement current: the resistors of the voltage divider may be dimensioned such that the measurement current corresponds to a decimal fraction of the output current.

Thus, the voltage drop at the shunt may be divided by the voltage divider via a ratio—in the ideal case a decimal ratio. This means that the voltage signal present at the shunt is further reduced. If, for example, a shunt at 2 A full load has a voltage drop of 250 mV, it would be easier to be able to take a reading for the user if, via the voltage divider, the current value of 2 A produces a signal of 200 mV that can be measured by the user. Thus, the relationship that 1 A corresponds to a measurement voltage of 100 mV, permits the current strength to be established in a simple manner merely by taking a reading and displacing the decimal point of the voltage value.

It is nevertheless advantageous if an, in particular fixed, conversion factor is provided on the power supply unit for converting the measurement voltage or the measurement current to the output current. The conversion factor could be printed directly at a location on the power supply unit that is accessible and visible to the operator, or it could be located on a sign that is applied to the power supply unit. Optimally, the conversion factor is positioned directly adjacent to the channel for the test point.

As an alternative to a fixed conversion factor, it is possible to provide a conversion factor depending on other relevant parameters, such as the input voltage. This may be shown in tabular form, provided as graphics, as a table or graphics with electrical-optical displays (for example, an LED shows which conversion factor now applies) or via a display.

In particular, when a fixed conversion factor is provided between the measurement voltage and/or measurement current, on the one hand, and the output current, on the other, the resistors of the voltage divider and/or the resistor may be adjustable in parallel to the shunt, so that depending on parameters that influence the output current, a conversion factor between the measurement voltage and/or measurement current, on the one hand, and the output current, on the other, may be adjusted. Thus, via setting controllers or selection switches, it is possible to adjust the influencing parameters (for example, the input voltage), where by influencing the voltage divider the conversion factor between the measured value (from the multi-meter) and the actual output current is corrected.

As a result of a voltage divider parallel to a shunt, which generally has low ohmic resistance, the tapping of the measurement voltage through a voltage measurement device, requires barely any or no additional protective measures against electrostatic discharge (ESD) or other interference pulses, because the shunt is generally connected to an output, for example an output terminal, directly (i.e., without the interposition of further electronic components) and corresponding protective measures are in any case provided for the output.

In particular, when a portion of a cable (for example, a conductor strip) or a conductor (for example, a wire) is used as the shunt, a compensation circuit may be provided by which the influence of changing temperature in the power supply unit and/or fluctuations in the duty cycle of the power supply unit may be reduced to the measurement voltage or the measurement current. If a cable or the wire of a throttle is used as the shunt, temperature dependency of the electrical resistor may be compensated for by the temperature dependency of the conductor material, generally copper. Thus, this temperature dependency should be compensated. If a cable or a winding material is used through which no current flows during the entire clocked period, the measurement voltage is dependent on the input voltage of the power supply unit. This may be significantly improved by a compensation circuit that evaluates the voltage level on the transformer.

The shunt itself and/or any voltage divider connected in parallel to the shunt and/or the conductors from and to the shunt and optionally the voltage divider, may also have a temperature dependency relevant to the measurement voltage or measurement current. As a result, a compensation circuit or a further temperature compensating measure may also be provided for the temperature dependency of these components.

The measurement contact points may be provided with terminals in order to be able to tap the measurement voltage or the measurement current. As a result, the need for the measurement to be performed via conductor strip-contact surfaces and therefore that a test point has to be directly positioned onto a conductor strip-contact surface is prevented. In addition, a terminal provides the possibility of guiding the discharged signal to a measurement device for continuous display or remote transmission.

The measurement contact points may be provided with at least one illumination element so as to be located more easily. In order to guide the operating electrician more easily to the current monitor and its measurement contact point and/or contact surface, it is also possible to illuminate the contact surface, the supply channel in the housing and/or the text field with the conversion factor via at least one LED, for example.

A power supply unit in accordance with the invention may be used to measure the output current such that, via the test points of a voltage or current measurement device at the measurement contact points of the power supply unit, the measurement voltage or measurement current may be tapped and from the measurement voltage and/or the measurement current, on the one hand, and the known connection between the measurement voltage and/or the measurement current and the current strength of the output current, on the other hand, the current strength of the output current corresponding to the measurement voltage and/or the measurement current is determined.

The solution in accordance with the invention is able to be used, in particular, in power supply units of low commercial value because, in these devices, a high cost pressure exists in development and production and the installation of expensive operating amplifiers and references is not possible for reasons of cost. Nevertheless, via the present invention, a current monitor may be implemented in which the current-proportional signal has an inaccuracy of less than 5%. The current monitor in accordance with the invention generally is only used as required, and accurate multi-meters belong to the standard equipment of an electrician. As a result, the accurate amplification and display of the measurement signal on a display may be transferred to the multi-meter without any disadvantage to the user.

In particular, when in any case a shunt is already present for the current limitation, in the optimal case when using a voltage divider only two resistors, for example as surface-mounted components (SMD), are additionally required as well as a conductor strip surface which is accessible through the housing, of for example 3 by 3 mm or 4 by 4 mm, which serves as a contact surface for the test point of the multi-meter.

The design of a separate channel in the housing for the test point of a voltage measurement device does not generally involves any significant increase in the cost of parts when using plastics for the housing but only costs in the one-off adaptation of the injection-molding tool are incurred.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

Reference is made in the following part of the description to the schematic figures for further explanation of the invention, from which further advantageous embodiments, details and developments of the invention may be derived, in which.

DETAILED DESCRIPTION OF THE EXEMPLARY EMBODIMENTS

Figure 1:
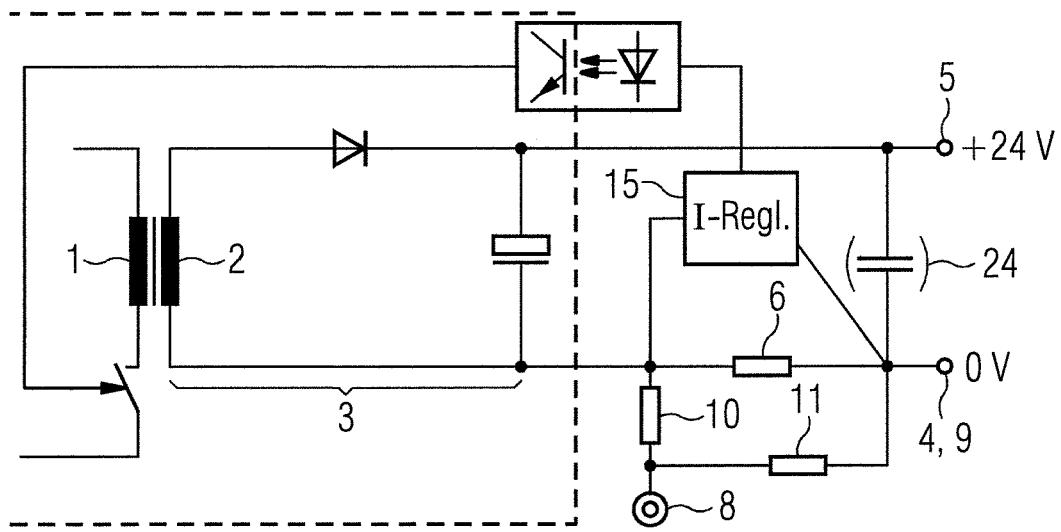
FIG. 1 shows a circuit of a power supply unit with a shunt and voltage divider in the vicinity of the negative output in accordance with the invention.

A power supply unit in accordance with the invention is shown in FIG. 1. The power supply unit 1 comprises a secondary winding 2 of a transformer, the primary winding 1 thereof also being illustrated. The secondary winding 2 is connected to a rectifier 3 that supplies the two outputs 4, 5 with voltage. An output capacitor 24 provides the output voltage at the outputs 4, 5 which, for example, may be configured as terminals. The voltage at the output 4 in this case is 0 V, at the output 5 the voltage is +24 V. The output voltage of, in this case, 24 V serves as control voltage for an electrical system.

In accordance with the invention, the circuit of FIG. 1 thus comprises a shunt 6 that is directly arranged upstream of the output 4, i.e., without further components therebetween, optionally upstream of the cable to the output capacitor 24. The voltage dropping at the shunt 6 is tapped by a current controller that, in this case, serves as a current limiting unit 15, in order to deliver a signal for limiting the output current at the pulse width modulator (PWM modulator) controlling the primary circuit transistors, when exceeding the pre-defined limit current, which as a result reduces the pulse width of the transistors.

In this case, the shunt 6 is arranged in the negative branch of the output circuit, which leads to the negative output 4. Here, a voltage divider consisting of two resistors 10, 11 is connected in parallel to the shunt 6, where the first measurement contact point 8 is provided between the two resistors 10, 11. No amplifier components are provided between the shunt 6 and the measurement contact point 8. The second measurement contact point 9 is formed by the output 4. In an alternative arrangement between the connecting point of the two resistors 10 and 11 and the measurement contact point 8 a further resistor (not shown) is connected in order to adjust a measurement current which may be detected by the multi-meter in the current-measuring mode.

Figure 2:
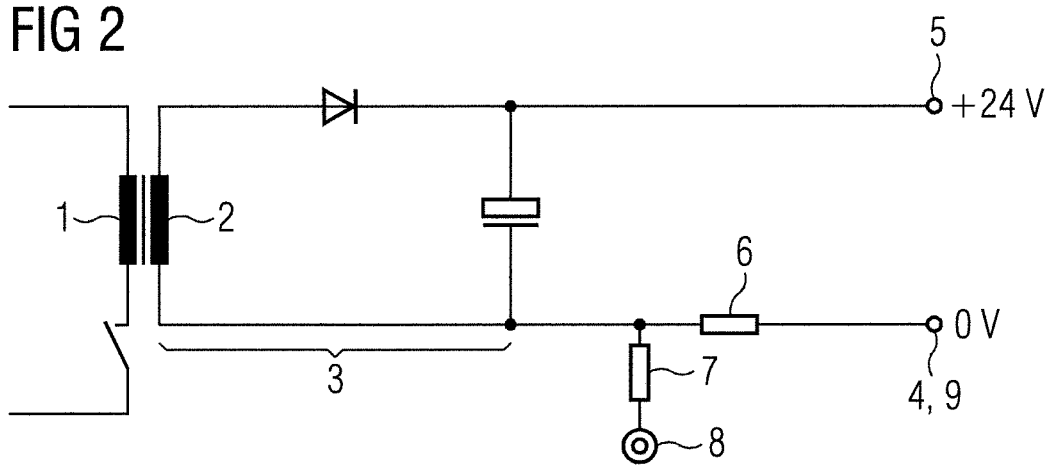
FIG. 2 shows a circuit of a power supply unit with a shunt only at the negative output in accordance with the invention.

The circuit in FIG. 2 is in principle the same as that in FIG. 1, but in FIG. 2 no voltage divider is provided but only one protective resistor 7 is provided between the shunt 6 and the first measurement contact point 8. The voltage upstream of the shunt 6 is tapped via the protective resistor 7, and the voltage downstream of the shunt 6 is tapped via the second measurement contact point 9 at the output 4. Equally, a current toward the second measurement contact point 9 may be defined via the protective resistor 7, so that a measurement current that is proportional to the output current of the power supply may be measured by the multi-meter in the current measuring mode. The shunt 6 may additionally be used for the current limitation, which is not illustrated here, or only for the measurement voltage and/or the measurement current.

The protective resistor 7 advantageously has a considerably higher ohmic resistance than the shunt 6 (for example, by a factor of 100 or more) and has amongst other things the purpose of protecting the power supply unit from inadvertently influencing the current limit, which may lead either to a destruction of the power supply unit or inadvertent shutdown. In the case of an error by the user, it might be possible that the multi-meter is adjusted to current measurement instead of voltage measurement, whereby the shunt installed in the multi-meter is connected in parallel to the shunt 6 in the power supply unit.

Figure 3:
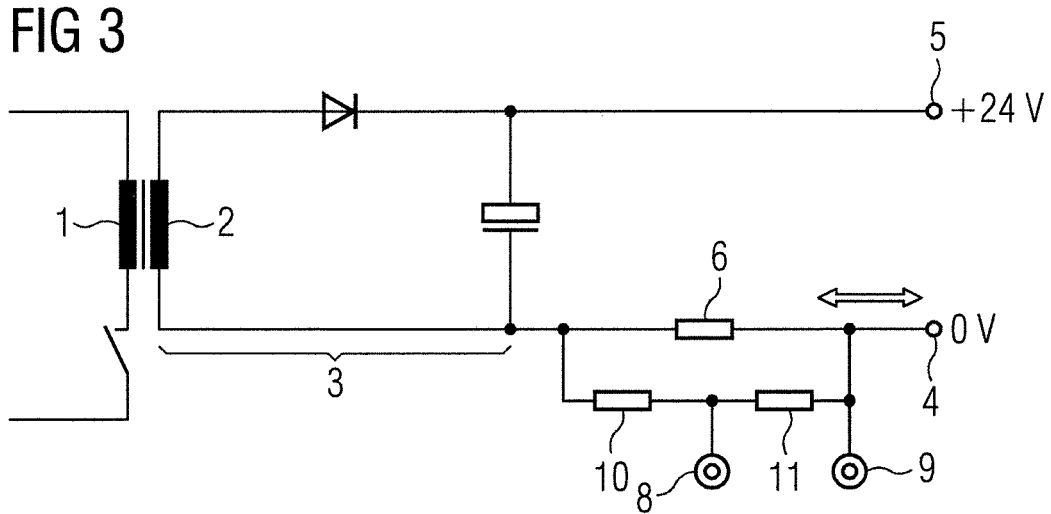
FIG. 3 shows a circuit of a power supply unit with a voltage divider and two separate measurement contact points in accordance with the invention.

FIG. 3 differs from FIG. 1 only in that the shunt 6 is separated from the output 4 by a longer conductive part (see double arrow), which conductive part could falsify the measurement voltage due to the voltage drop caused thereby. Therefore, in FIG. 3 the second measurement contact point 9 is not provided at the output 4 but downstream of the resistor 11 of the voltage divider. The first measurement contact point 8 is located between the resistor 10 and the resistor 11. Thus, the voltage drop at the resistor 11 is measured, where the resistor 11 is dimensioned such that the voltage drop corresponds to a decimal fraction of the output current.

Alternatively, the voltage divider may be dimensioned such that a multi-meter measures a corresponding current between the two measurement contact points 8, 9, which is also proportional to the output current of the power supply. In the simplest case, the circuit of FIG. 3 may be used, where the resistor 11 is not necessary. The adjustment of the conversion factor between the output current and the measurement current may exclusively occurs by the dimensioning of the resistor 10.

Figure 4:
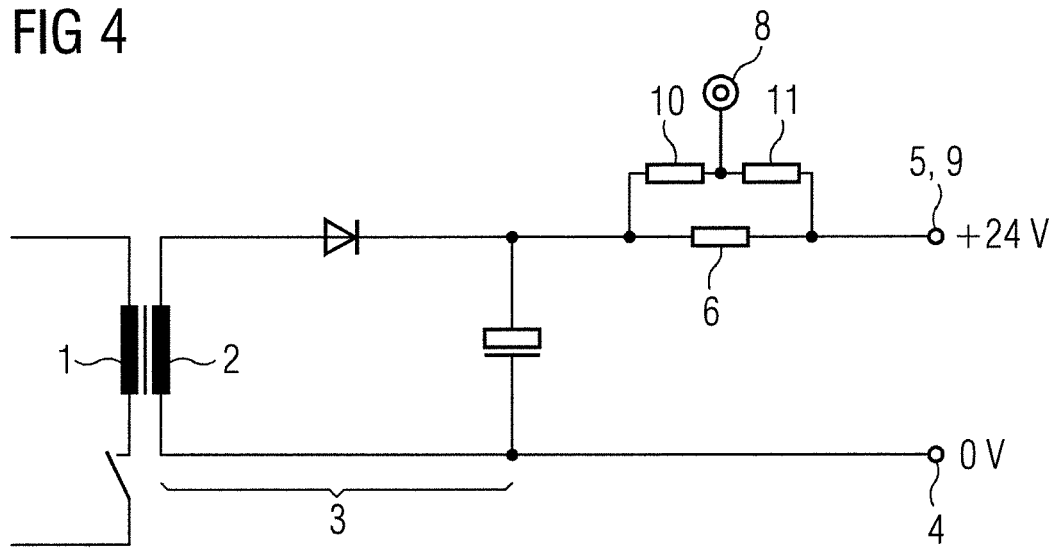
FIG. 4 shows the circuit of FIG. 1 but for the positive output.

FIG. 4 shows a circuit as in FIG. 1 but here the shunt 6 is arranged in the positive branch of the output circuit which leads to the positive output 5. Accordingly, the second measurement contact point 9 may be formed here by the positive output 5. In this case, the shunt 6 may be used additionally for the current limitation, which is not illustrated here, or only for the measurement voltage. Equally, a measurement current may be alternatively used here, by the current flowing from the measurement contact point 8 to the measurement contact point 9 being measured by the multi-meter. In this case, the resistor 11 is not necessary.

Figure 5:
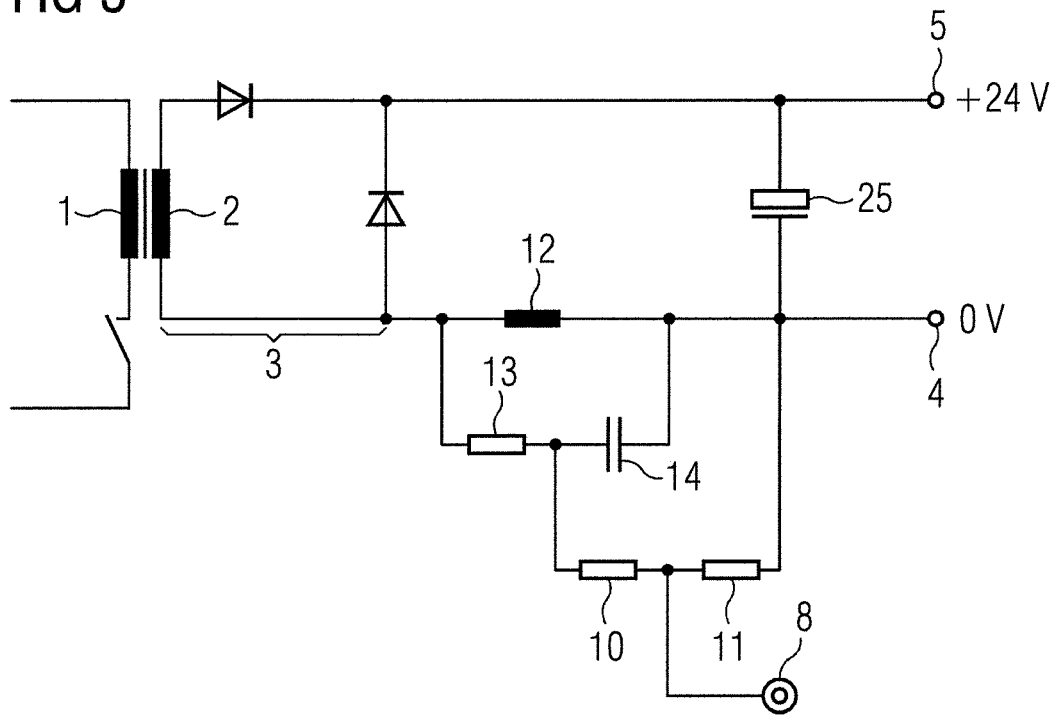
FIG. 5 shows a circuit using a winding material as the shunt in accordance with the invention.

FIG. 5 shows a circuit by using a winding material 12 as the shunt which is arranged in the negative branch of the output circuit, between the rectifier 3 and the operating capacitor 25 which in turn is located between the outputs 4, 5. For the winding material 12 an RC member is connected in parallel, consisting of the resistor 13 and the capacitor 14. The voltage divider disclosed in FIG. 1 branches off between the resistor 13 and the capacitor 14 and between the winding material 12 (downstream of the RC member) and the output 4 again leads into the negative output circuit. The first measurement contact point 8 is located between the resistor 10 and the resistor 11 of the voltage divider. Once again the negative output 4 serves as a second measurement contact point 9. Here, it is once again possible from the voltage applied to the capacitor 14 to conduct and to evaluate a measurement current from the measurement contact point 8 to the output point 4 by tapping performed via the resistor 10 and the multi-meter in the current measuring mode. In the simplest case, the resistor 11 may be dispensed with. By integration of the voltage drop on the winding material 12 via the RC member, the RC member already has a very high ohmic resistance. Accordingly, substantially lower values have to be assumed by an uncoupling of the measurement current, so that the RC member is subjected to as little load as possible whereby the signal would be distorted.

In FIG. 5, however, the measurement voltage could also be tapped directly by omitting the voltage divider, via a first measurement contact point 8 provided between the resistor 13 and capacitor 14, and passed out of the power supply unit.

Figure 6:
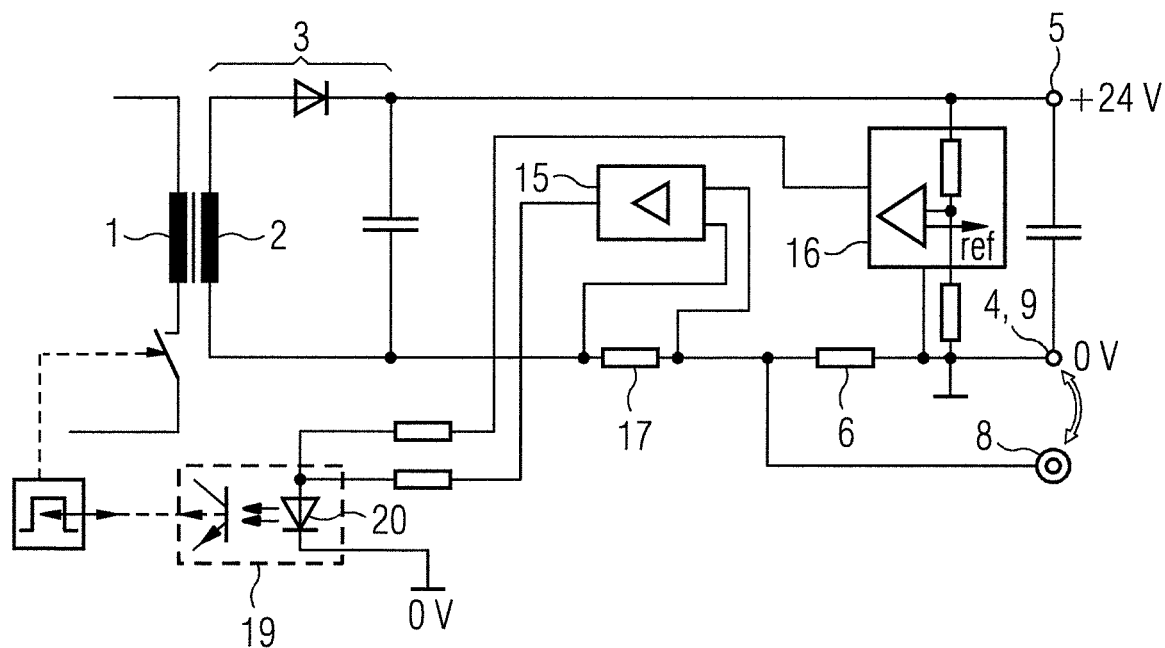
FIG. 6 shows a circuit using an additional shunt for the same output in accordance with the invention.

The circuit of FIG. 6 shows that, even in the presence of a shunt 17 for a current limiting unit 15, a suitable additional shunt 6 may be provided simply for measuring the measurement voltage from which the output current is determined.

In the same branch, in this case the negative branch, of the output circuit coming from the secondary winding 2, a shunt 17 is initially provided for the current limiting unit 15 and then a shunt 6 is provided simply for measuring the measurement voltage. Between the shunt 6 and the negative output 4 a further branch is provided to the voltage regulator 16. Since otherwise no components are present between the shunt 6 and the output 4, this branch is able to serve as a second measurement contact point 9. The first measurement contact point 8 is provided upstream of the shunt 6. In turn, via an individual resistor the voltage drop at, the shunt 6 could also be converted here into a proportional measurement current which is measured at the measurement contact point 9 by the multi-meter.

In the prior art, in clocked power supplies a voltage regulator 16 measures the output voltage and compares this with a reference voltage. In this case, generally an operation amplifier is used as the comparator which is formed with a suitable feedback as a regulator. The deviation from the reference voltage produced by the regulator and an illustration of the output voltage is the control signal that is influenced by the duty cycle of the (generally primary) switching transistors. A conventional embodiment, in this case, is that the generation of the activation signal by pulse width modulation (PWM) occurs on the primary side. The PWM signal is in turn significantly influenced by the control signal of the voltage regulator 16. The voltage regulator 16 is located on the secondary side, however. As a result, it is necessary to overcome the potential barrier with an insulating signal transmission path. In this case, optocouplers 19 which have a transmission diode 20 (generally an infrared LED) and a receiving transistor have proved expedient. Here, the transmission diode 20 is activated by the control signal of the output voltage regulator 16, and controls the optically sensitive transistor on the primary side in its conductivity. With the variable conductivity of the optically sensitive transistor in the optocoupler 19, the duty cycle (PWM) signal is altered, whereby the switch-on period of the primary switching transistors is altered, where the switching transistors connect the primary winding 1 of the transformer during the switch-on time directly to the primary intermediate circuit capacitors.

If, in addition, to the voltage regulator 16, a further current regulator 15 located on the secondary side is provided, then this further current regulator also compares a signal which corresponds to the output current (i.e., from the shunt 6) with a reference. This current regulator 15 is generally also configured as an operation amplifier with feedback. As a result, a signal may be discharged at the control output that significantly alters when it exceeds a limit value set by the reference. Generally, this signal is connected in an OR-circuit to the transmission diode 20 of the optocoupler 19, and namely so that both regulators 15, 16 separately from one another are able to activate the transmission diode 20, if the output voltage or the output current exceeds the respective limit value. If the circuit is configured in such a manner, when activating the transmission diode 20 by one of the two control signals then the conductivity of the optically sensitive transistor is increased. The transistor is expediently connected to the PWM regulator such that in this case the switch-on time is reduced and as a result the output voltage and the output current is reduced.

Figure 7:
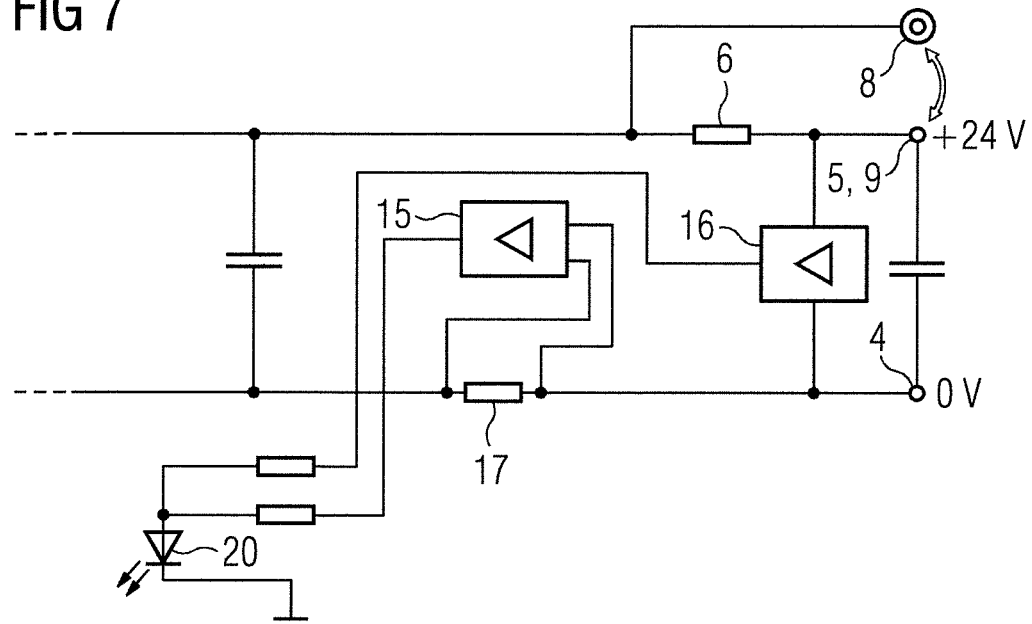
FIG. 7 shows a circuit using an additional shunt for the other output in accordance with the invention.

FIG. 7 shows an embodiment of the circuit of FIG. 6, where the additional shunt 6 is arranged in the positive branch of the output circuit, and also upstream of the branch to the voltage regulator 16, where however no further components are provided between the shunt 6 and the positive output 5. In FIG. 7, the first measurement contact point 8 is provided directly upstream of the shunt 6, and the second measurement contact point 9 is the positive output 5. However, it might also be conceivable that in FIG. 7 the shunt 17 and the current limiting unit 15 are also arranged in the positive branch.

Figure 8:
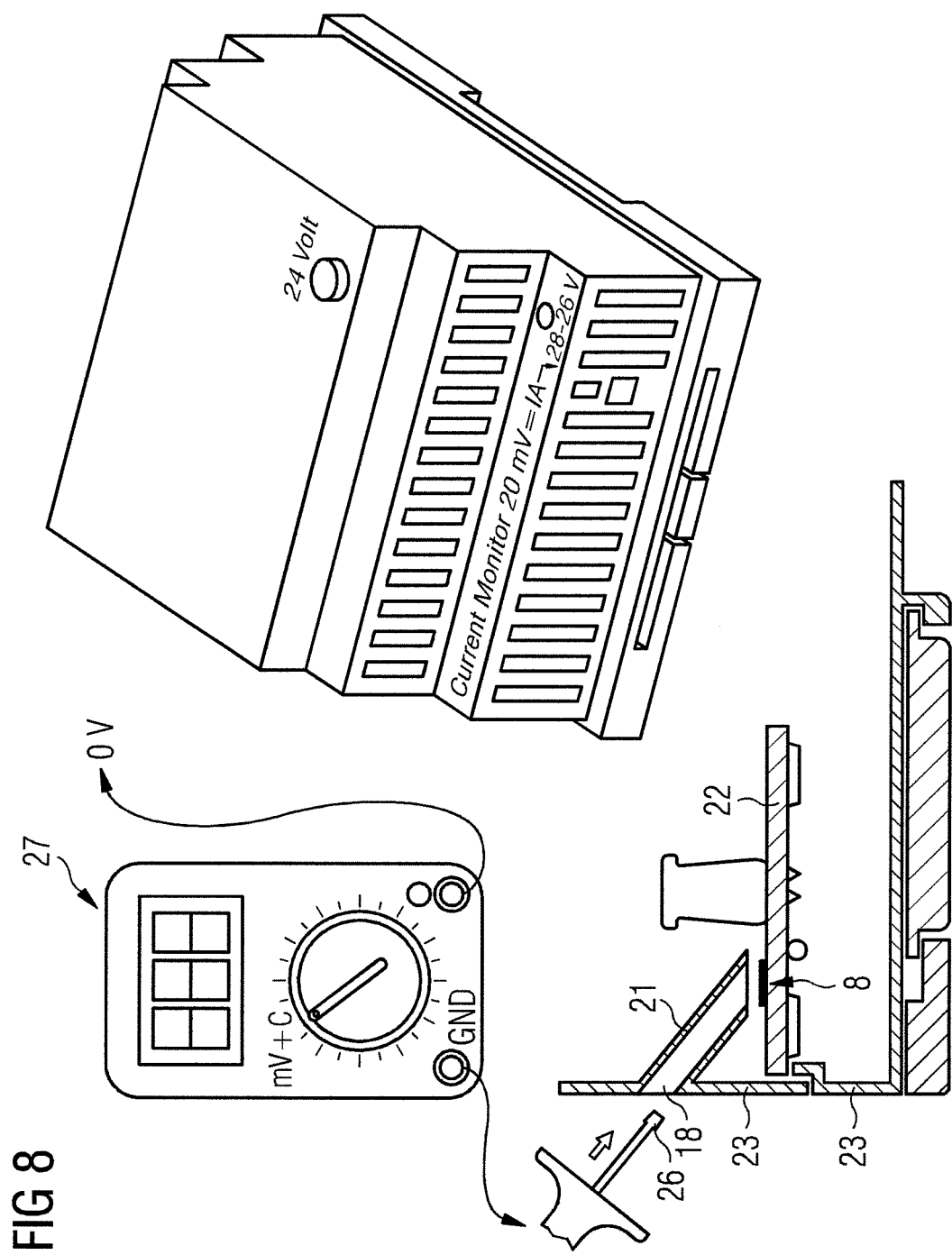
FIG. 8 shows a cross section through a housing of a power supply unit, with a channel and measurement contact point in accordance with the invention.

FIG. 8 shows, bottom left, a cross section through the housing 23 of a power supply unit which is shown to the right by way of example. The individual conductors and components of the power supply unit are provided on a printed circuit board 22, where in this case only one first measurement contact point 8 (such as a tin-plated surface) is shown on the printed circuit board. A channel 21 formed by the housing leads from an opening 18 in the housing 23 into the interior, which terminates at a distance from the measurement contact point 8. Here, the diameter of the channel 21 corresponds approximately to the diameter of the measurement contact point 8. The test point 26 of a voltage or current measuring device (multi-meter 27) may be inserted through this channel 21 and thus the measurement contact point 8 may be brought into contact without the test point 26 diverting into other regions of the printed circuit board 22. Such channels 21 may be provided for the measurement contact points 8 of FIGS. 1-7 and for the measurement contact points 9 of FIG. 3.

The other electrical cable of the multi-meter 27 is connected to the 0 V terminal of the power supply unit, which is shown by the arrow and "0 V". A conversion factor for converting a measurement voltage to the output current is printed on the power supply unit: "current monitor 20 mV=1 A".

In principle, the power supply unit in accordance with the invention is also able to be used for purposes other than for providing a control voltage.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those element steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A clocked power supply unit with low-voltage output for direct current, comprising:
   at least one secondary winding of a transformer;
   a rectifier connected to the secondary winding;
   a plurality of outputs at which a predefined output voltage is tapped;
   a shunt which is configured to provide one of a voltage signal and current signal which is proportional to an output current;
   electrical measurement contact points at a measurement current diverted from the shunt is tapped from outside the power supply unit via test points of at least one of a voltage measuring device and a current measuring device; and
   a voltage divider consisting of at least two resistors and arranged parallel to the shunt;
   wherein an amplifier component is not provided between the shunt and the measurement contact points; and
   wherein at least one measurement contact point of the measurement contact points is arranged between the at least two resistors of the voltage divider, such that one of (i) a partial voltage of a voltage which drops at the shunt is measureable on at least one resistor of the voltage divider and (ii) a measurement current flowing through at least one resistor of the voltage divider toward another measurement contact point of the measurement contact points may be tapped.

2. The power supply unit as claimed in claim 1, wherein the shunt is connected to a current limiting unit.

3. The power supply unit as claimed in claim 1, further comprising:
   a filter having a cutoff frequency which is smaller than a clock frequency of the power supply unit for a measurement voltage diverted from a voltage drop;
   wherein the shunt comprises a portion of a winding material of the clocked power supply unit.

4. The power supply unit as claimed in claim 1, wherein the shunt comprises a portion of an electrical connection.

5. The power supply unit as claimed in claim 1, wherein a first measurement contact point of the electrical measurement contact points is provided upstream and a second measurement contact point electrical measurement contact points provided immediately downstream of the shunt in an output current circuit.

6. The power supply unit as claimed in claim 1, wherein at least one measurement contact point of the electrical measurement contact points is located or arranged on a conductor strip in the power supply unit; and wherein at least one measurement contact point of the electrical measurement contact points is located or arranged on the conductor strip in the power supply unit can be brought into contact via an opening in a housing of the power supply unit.

7. The power supply unit as claimed in claim 6, further comprising:
a channel for guiding a test point of the voltage measuring device arranged between the opening and the at least one measurement contact point.

8. The power supply unit as claimed in claim 6, wherein a first measurement contact point of the electrical measurement contact points is located or arranged on the conductor strip in the power supply unit.

9. The power supply unit as claimed in claim 1, wherein at least one measurement contact point of the electrical measurement contact points comprises an output of the power supply unit.

10. The power supply unit as claimed in claim 9, wherein the second measurement contact point comprises the output of the power supply unit.

11. The power supply unit as claimed in claim 1, further comprising:
an RC member arranged between the shunt and at least one measurement contact point of the measurement contact points to smooth a signal from the shunt.

12. The power supply unit as claimed in claim 1, wherein a resistor at which a partial voltage may be tapped, in comparison with remaining resistors of the voltage divider, is dimensioned such that the partial voltage corresponds to a decimal fraction of the output current.

13. The power supply unit as claimed in claim 12, wherein at least one of (i) the at least two resistors of the voltage divider and (ii) the resistor parallel to the shunt are dimensioned such that the measurement current corresponds to a decimal fraction of the output current.

14. The power supply unit as claimed in claim 1, wherein at least one of (i) the at least two resistors of the voltage divider and (ii) the resistor parallel to the shunt are dimensioned such that the measurement current corresponds to a decimal fraction of the output current.

15. The power supply unit as claimed in claim 1, wherein at least one of (i) the at least two resistors of the voltage divider and (ii) the resistor parallel to the shunt are adjustable such that, depending on parameters which influence the output current, a conversion factor between (A) at least one of (i) the measurement voltage and (ii) the measurement current and (B) the output current is adjustable.

16. The power supply unit as claimed in claim 1, further comprising:
at least one resistor arranged parallel to the shunt wherein at least one measurement contact point is provided at the resistor;
wherein a measurement current flowing through the at least one resistor toward another electrical measurement contact point may be tapped.

17. The power supply unit as claimed in claim 16, wherein at least one of (i) at least two resistors of a voltage divider and (ii) the resistor parallel to the shunt are dimensioned such that the measurement current corresponds to a decimal fraction of the output current.

18. The power supply unit as claimed in claim 1, wherein the power supply unit includes a conversion factor for converting a measurement voltage or the measurement current to the output current.

19. The power supply unit as claimed in claim 18, wherein the conversion factor is a fixed conversion factor.

20. The power supply unit as claimed in claim 1, wherein the power supply unit is provided with a conversion factor depending on parameters which influence the output current.

21. The power supply unit as claimed in claim 1, further comprising:
a compensation circuit by which at least one of (i) influences of changing temperature in the power supply unit are reduced and (ii) fluctuations in a duty cycle of the power supply unit on the measurement voltage or the measurement current are reduced.

22. The power supply unit as claimed in claim 1, wherein the electrical measurement contact points include terminals for tapping one of a measurement voltage or the measurement current.

23. The power supply unit as claimed in claim 1, wherein the electrical measurement contact points include at least one illumination element to increase an ease at which the measurement contact points are located.

24. The power supply unit as claimed in claim 1, wherein the power supply unit measures the output current;
wherein one of (i) a measurement voltage or (ii) the measurement current is tapped via test points at the electrical measurement contact points of the power supply unit by one of (i) the voltage measuring device and (ii) the current measuring device; and
wherein a present level of the output current corresponding to at least one of (i) the measurement voltage and (ii) the measurement current is determined from (A) at least one of (i) the measurement voltage and (ii) the measurement current and from (B) a known connection.

25. The power supply unit as claimed in claim 24, wherein the known connection is between (A) at least one of (i) the measurement voltage and (ii) the measurement current, and (B) the present level of the output current.

* * * * *